United States Patent
Lee et al.

(10) Patent No.: US 12,411,161 B2
(45) Date of Patent: Sep. 9, 2025

(54) CHAMBER FOR MEASURING PERFORMANCE OF ANTENNA, SYSTEM INCLUDING THE SAME, AND OPERATING METHOD THEREOF

(71) Applicant: SAMSUNG ELECTRONICS CO., LTD., Suwon-si (KR)

(72) Inventors: Ungryeol Lee, Suwon-si (KR); Myeonggeun Kim, Suwon-si (KR); Nohwan Park, Suwon-si (KR); Jongseo Park, Suwon-si (KR); Jaeyup Lee, Suwon-si (KR); Yungil Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 300 days.

(21) Appl. No.: 17/903,382

(22) Filed: Sep. 6, 2022

(65) Prior Publication Data
US 2023/0089785 A1 Mar. 23, 2023

Related U.S. Application Data

(63) Continuation of application No. PCT/KR2022/012820, filed on Aug. 26, 2022.

(30) Foreign Application Priority Data

Sep. 15, 2021 (KR) .................. 10-2021-0123254

(51) Int. Cl.
*G01R 29/10* (2006.01)
*G01R 29/08* (2006.01)
(Continued)

(52) U.S. Cl.
CPC ......... *G01R 29/0821* (2013.01); *H04B 17/11* (2015.01); *H04B 17/21* (2015.01)

(58) Field of Classification Search
CPC .. H01Q 1/12; H01Q 1/27; H01Q 3/00; H01Q 3/08; H01Q 3/12; G01R 29/0821;
(Continued)

(56) References Cited

U.S. PATENT DOCUMENTS

| 7,873,339 B2 * | 1/2011 | Qi .......................... H04B 17/29 455/425 |
| 11,047,894 B2 | 6/2021 | Kvarnstrand et al. |

(Continued)

FOREIGN PATENT DOCUMENTS

| KR | 10-1009630 | 1/2011 |
| KR | 10-2020-0110370 | 9/2020 |

OTHER PUBLICATIONS

Search Report and Written Opinion dated Dec. 20, 2022 issued in International Patent Application No. PCT/KR2022/012820.

*Primary Examiner* — Thai Pham
(74) *Attorney, Agent, or Firm* — Nixon & Vanderhye P.C.

(57) ABSTRACT

An anechoic antenna chamber includes: a holder on which a device under test (DUT) is configured to be mounted, at least one first antenna configured to radiate a first test signal of a first frequency band, a second antenna provided at an inner side of the antenna chamber and configured to radiate a second test signal of a second frequency, at least one driver configured to rotate the DUT, and a control circuit operatively connected with the at least one first antenna, the second antenna, and the at least one driving part. The control circuit is configured to control the driver to rotate the DUT and control the at least one first antenna to radiate the first test signal having an intensity of a specified range and control the second antenna to radiate the second test signal, while rotating the DUT.

19 Claims, 11 Drawing Sheets

(51) Int. Cl.
  *H04B 17/11* (2015.01)
  *H04B 17/15* (2015.01)
  *H04B 17/21* (2015.01)

(58) Field of Classification Search
  CPC ...... G01R 29/10; G01R 29/105; H04B 17/00; H04B 17/0085; H04B 17/11; H04B 17/15; H04B 17/21; H04B 17/29
  See application file for complete search history.

(56) References Cited

U.S. PATENT DOCUMENTS

| | | | |
|---|---|---|---|
| 11,515,952 B1* | 11/2022 | Hsieh | H04W 52/50 |
| 2010/0109957 A1 | 5/2010 | Moon et al. | |
| 2013/0271317 A1 | 10/2013 | Goel et al. | |
| 2014/0087668 A1* | 3/2014 | Mow | H04W 24/08 |
| | | | 455/67.14 |
| 2014/0256267 A1* | 9/2014 | Chien | H04B 17/15 |
| | | | 455/67.12 |
| 2017/0223559 A1* | 8/2017 | Kong | H04B 7/0413 |
| 2020/0244377 A1* | 7/2020 | Maruo | H04B 5/20 |
| 2020/0341044 A1* | 10/2020 | Kvarnstrand | H04B 17/309 |
| 2021/0399811 A1* | 12/2021 | Endo | H04B 17/15 |
| 2023/0033833 A1* | 2/2023 | Maruo | G01R 29/105 |

* cited by examiner

| ANGLE($\theta, \phi$) | L5 CN0 | EXISTING ANTENNA CHAMBER | | IMPROVED ANTENNA CHAMBER | |
|---|---|---|---|---|---|
| | | L5 SENSITIVITY | TIS | L5 SENSITIVITY | TIS |
| (90, 90) | 36.2 | 142 | 143.9 | 155 | 156.9 |
| (90, 210) | 30.2 | 144 | 151.9 | 149 | 156.9 |
| (90, 240) | 34 | 145 | 149.1 | 153.5 | 157.6 |
| (90, 300) | 37.8 | 139 | 139.3 | 156 | 156.3 |
| (30, 180) | 37.6 | 143.5 | 144 | 155.5 | 156 |
| | | Max-Min | 12.6 | Max-Min | 2 |

CHAMBER FOR MEASURING PERFORMANCE OF ANTENNA, SYSTEM INCLUDING THE SAME, AND OPERATING METHOD THEREOF

CROSS-REFERENCE TO RELATED APPLICATIONS

This application is a continuation of International Application No. PCT/KR2022/012820 designating the United States, filed on Aug. 26, 2022, in the Korean Intellectual Property Receiving Office and claiming priority to Korean Patent Application No. 10-2021-0123254, filed on Sep. 15, 2021, in the Korean Intellectual Property Office, the disclosures of which are incorporated by reference herein in their entireties.

BACKGROUND

Field

The disclosure relates to a chamber for measuring the performance of an antenna, a system including the same, and an operating method thereof.

Description of Related Art

With the development of information technology (IT), various types of electronic devices such as smartphones, tablet personal computers (PCs) have been spread widely. The electronic device may transmit and receive a wireless signal with another electronic device or a base station using an antenna. The electronic device may perform various functions (e.g., wireless communication and positioning) based on information included in the wireless signal.

An anechoic antenna chamber may be used to measure antenna performance of the electronic device. The antenna chamber may be a small room surrounded by a wall having an anechoic characteristic, which may at least one antenna for radiating a test signal and a device under test (DUT) for receiving the test signal.

The antenna chamber may be designed to measure communication performance of the DUT for the test signal in various use environments. For example, to measure a receive sensitivity of the test signal received by the DUT at various angles, the antenna chamber may rotate the DUT while radiating the test signal using the at least one antenna. For example, when the DUT is used in the city center, an obstacle, which obstructs movement of a signal, may be disposed in the antenna chamber to measure communication performance of the DUT.

A test signal may include a plurality of test signals (e.g., a first test signal and a second test signal), each of which has a different frequency. The measurement of a receive sensitivity of a test signal (e.g., the second test signal) to be measured among the plurality of test signals may be based on another test signal (e.g., the first test signal). For example, a DUT may measure a receive sensitivity of the second test signal in response to that the first test signal is received.

An intensity of the first test signal received by the DUT may be a weak electric field, at a specific angle. Alternatively, the DUT may fail to receive the first test signal at the specific angle. In this case, the measurement of a receive sensitivity for the second test signal, which is performed in the antenna chamber, may be inaccurate. A method for improving the accuracy of measuring a receive sensitivity of the second test signal is needed.

SUMMARY

In accordance with an example embodiment of the disclosure, an anechoic antenna chamber is provided. The anechoic antenna chamber may include: a holder configured to provide a mount on which a device under test (DUT) is mounted, at least one first antenna configured to radiate a first test signal of a first frequency band, a second antenna provided at an inner side of the antenna chamber and configured to radiate a second test signal of a second frequency, at least one driver configured to rotate the DUT, and a control circuit operatively connected with the at least one first antenna, the second antenna, and the at least one driver. The control circuit may be configured to rotate the DUT using the at least one driver and control the first antenna to radiate the first test signal having an intensity of a specified range and control the second antenna to radiate the second test signal, while rotating the DUT.

According to various example embodiments of the disclosure, the antenna chamber may maintain some (e.g., a first test signal) of test signals received by a DUT at a specified level, thus improving the accuracy of measuring a receive sensitivity of a test signal (e.g., a second test signal) to be measured.

In addition, various effects ascertained directly or indirectly through the disclosure may be provided.

The effects that are achieved through various example embodiments of the disclosure may not be limited to what has been particularly described herein, and other advantages not described herein may be more clearly understood from the following detailed description by persons skilled in the art.

BRIEF DESCRIPTION OF THE DRAWINGS

The above and other aspects, features and advantages of certain embodiments of the present disclosure will be more apparent from the following detailed description, taken in conjunction with the accompanying drawings, in which:

FIG. 7C is a table illustrating a sensitivity and a TIS of a test signal, according to various embodiments;

With regard to description of drawings, the same or similar components will be marked by the same or similar reference signs.

DETAILED DESCRIPTION

Figure 1:
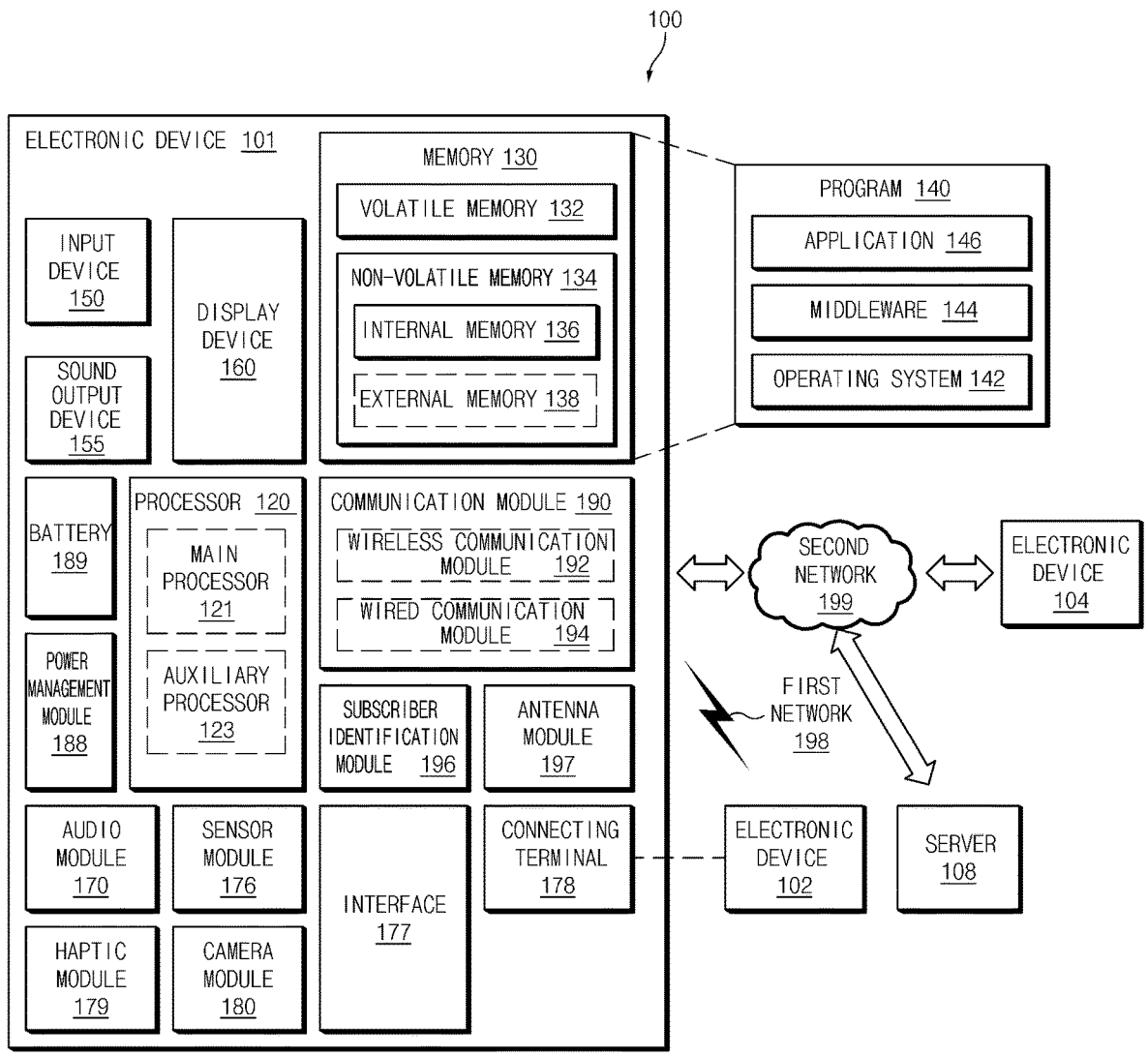
FIG. 1 is a block diagram illustrating an example electronic device in a network environment according to various embodiments.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
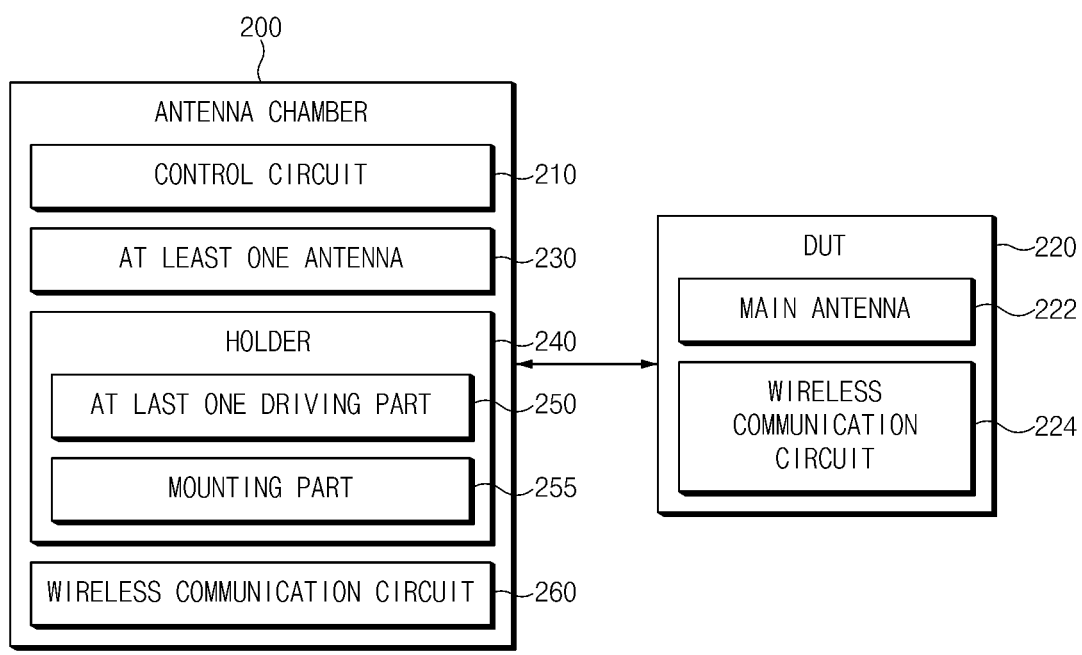
FIG. 2 is a block diagram illustrating an example configuration of an antenna chamber, according to various embodiments.
Figure 3:
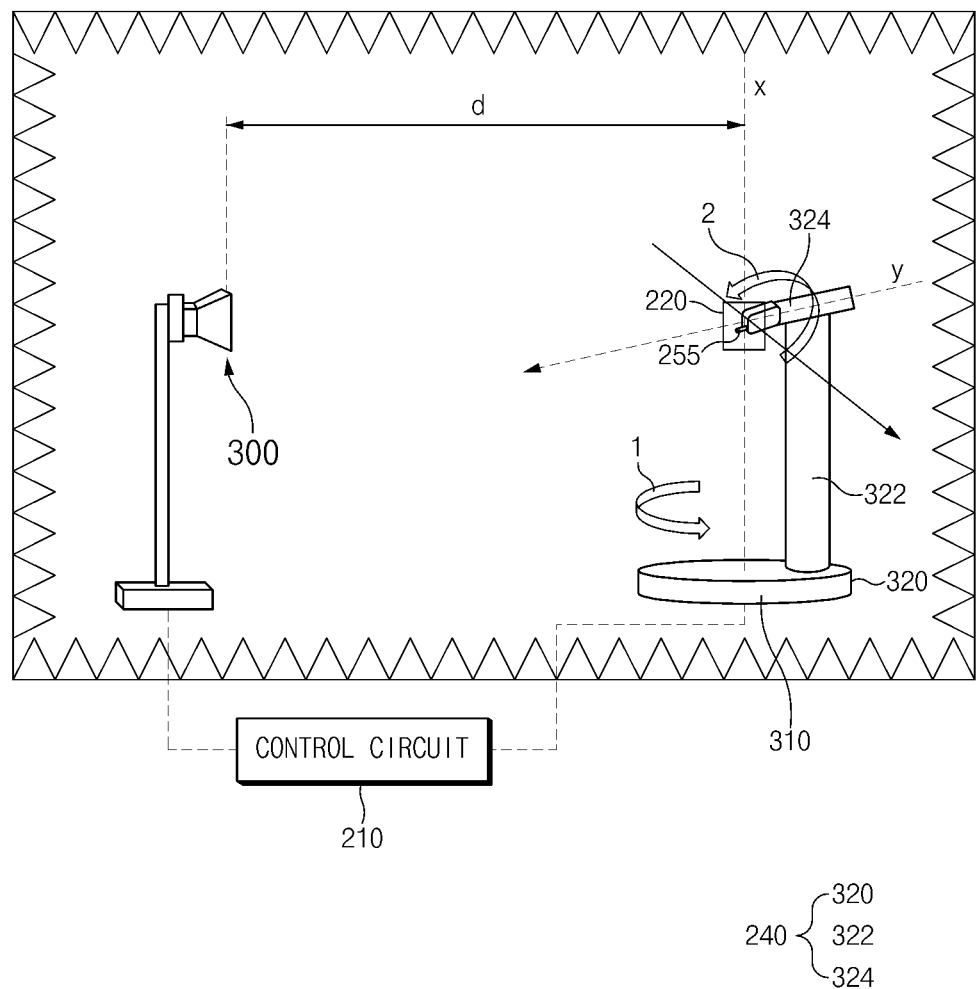
FIG. 3 is a diagram illustrating an example antenna chamber, according to various embodiments.
Figure 4A:
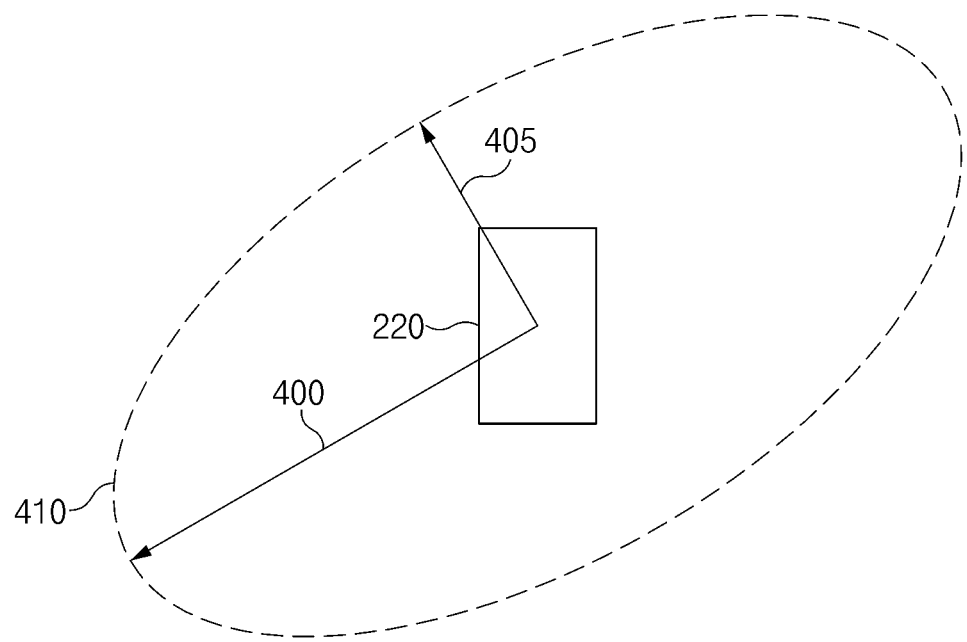
FIG. 4A is a diagram illustrating an example radiation pattern formed by a test signal according to various embodiments.
Figure 4B:
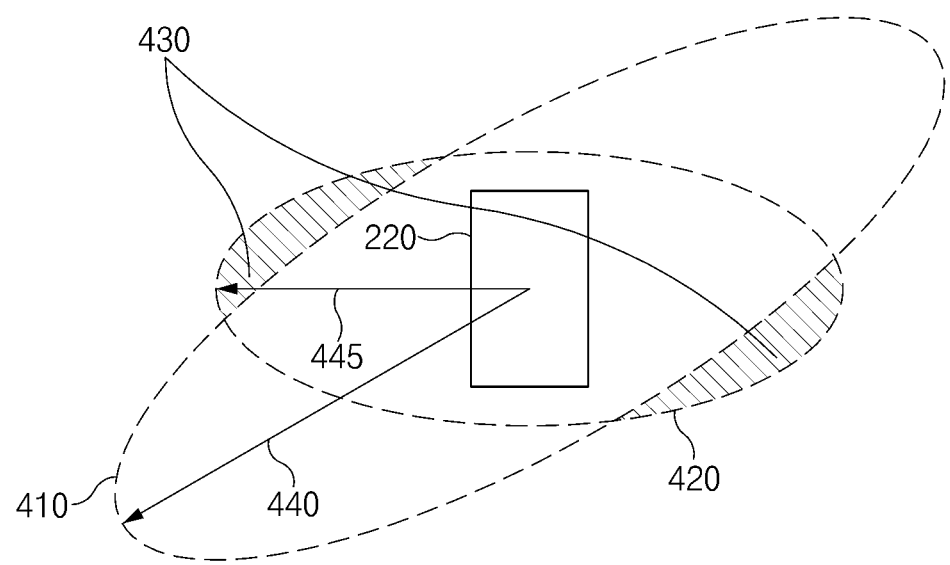
FIG. 4B is a diagram illustrating an example radiation pattern formed by a test signal according to various embodiments.

FIG. 2 is a block diagram illustrating an example configuration of an antenna chamber, according to various embodiments. FIG. 3 is a diagram illustrating an example antenna chamber, according to various embodiments. FIG. 4A is a diagram illustrating an example radiation pattern formed by a test signal according to various embodiments. FIG. 4B is a diagram illustrating an example radiation pattern formed by a test signal according to various embodiments.

In an embodiment, an antenna chamber 200 may include a control circuit 210, at least one antenna 230, a holder 240, and/or a wireless communication circuit 260. A DUT 220 (e.g., an electronic device 101 of FIG. 1) may be disposed in the antenna chamber 200. For example, the DUT 220 may be mounted on a mounting part 255 of the holder 240 in the antenna chamber 200.

The control circuit 210 may be operatively connected with the at least one antenna 230, the holder 240, and/or the wireless communication circuit 260. The control circuit 210 may include a simulator and/or a measurement device or may be implemented as a part thereof. For example, the control circuit 210 may include a network emulator, a global navigation satellite system (GNSS) simulator, and/or a positioning controller or may be implemented as a part thereof.

The control circuit 210 may control operations of components included in the antenna chamber 200. For example, the control circuit 210 may radiate a test signal (e.g., a global positioning system (GPS) signal) using the at least one antenna 230. For example, the control circuit 210 may rotate some of the at least one antenna 230 in a clockwise direction or a counterclockwise direction. For example, the control circuit 210 may control such that the at least one antenna 230 radiates a test signal, in a state where it rotates some of the at least one antenna 230 90 degrees in a clockwise direction. For example, the control circuit 210 may control at least one driving part 250 to rotate the mounting part 255. For example, the control circuit 210 may transmit and receive information associated with the test signal with the DUT 220 through the wireless communication circuit 260.

The at least one antenna 230 may be disposed at a specified position in the antenna chamber 200. For example, some of the at least one antenna 230 may be arranged at an inner side of the antenna chamber 200. For example, some (e.g., at least one first antenna) of the at least one antenna 230 may be mounted on the mounting part 255 of the holder 240. For example, some (e.g., the at least one first antenna) of the at least one antenna 230 may be arranged on an inner wall of the antenna chamber 200.

The at least one antenna 230 may radiate a test signal. For example, the test signal may be a signal based on a wireless communication (e.g., long term evolution (LTE) communication or new radio (NR) communication) protocol and/or a signal based on a global navigation satellite system (GNSS) protocol.

In an embodiment, the test signal may include a plurality of test signals of different frequency bands. For example, the plurality of test signals may be global positioning system (GPS) signals. For example, the plurality of test signals may include at least one of an L1 signal or an L5 signal. The L1 signal may be, for example, a signal of the 1575.42 MHz band, which may be a signal used for positioning. The L5 signal may be, for example, a signal of the 1176.45 MHz band, which may be a signal used for positioning.

The holder 240 may be disposed at a specified position in the antenna chamber 200. For example, the holder 240 may be disposed spaced apart from the at least one antenna 230 at a specified interval. The specified interval may be an interval suitable for measuring a receive sensitivity of the test signal radiated from the at least one antenna 230 at the DUT 220 mounted on the mounting part 255.

The holder 240 may include the at least one driving part (e.g., including, for example, a driver, a motor, etc.) 250 and/or the mounting part 255.

The mounting part 255 may receive other components associated with the antenna chamber 200. For example, the mounting part 255 may receive the DUT 220. For another example, the mounting part 255 may receive some (e.g., the at least one first antenna) among the at least one antenna 230.

The at least one driving part 250 may rotate at least one joint (e.g., a bearing structure) of the holder 240 to rotate and/or move the mounting part 255. The components mounted on the mounting part 255 may rotate and/or move together with the mounting part 255. For example, the DUT 220 may rotate together with the rotation of the mounting part 255. When the DUT 220 rotates, a main antenna 222 of the DUT 220 may rotate at a fixed position in the antenna chamber 200. In this case, the main antenna 222 may be understood as being located on a rotary axis of the mounting part 255.

The wireless communication circuit 260 may include an antenna for assisting in test. For example, the wireless communication circuit 260 may include an antenna for assisting in communication (e.g., LTE, WCDMA, CDMA, or Wi-Fi communication) between the DUT 220 and the control circuit 210. The control circuit 210 may transmit and receive information associated with the test signal with the DUT 220 through the wireless communication circuit 260.

The DUT 220 may include the main antenna 222 (e.g., an antenna module 197 of FIG. 1) and/or a wireless communication circuit 224 (e.g., a communication module 190 of FIG. 1).

The main antenna 222 may receive the test signal radiated by the at least one antenna 230.

The wireless communication circuit 224 may transmit information associated with the test signal to the control circuit 210 or may receive the information associated with the test signal from the control circuit 210. For example, the wireless communication circuit 224 may include an auxiliary antenna for assisting in communication (e.g., LTE, WCDMA, CDMA, or Wi-Fi communication) between the DUT 220 and the control circuit 210. The wireless communication circuit 224 may transmit and receive the information associated with the test signal with the control circuit 210 through the auxiliary antenna.

Referring to FIG. 3, the antenna chamber 200 may, for example, be an anechoic chamber. The antenna chamber 200 may have a plurality of embossing structures at its inner side. For example, a test signal which arrives at a wall surface of the antenna chamber 200 among test signals radiated from the at least one antenna 230 may be absorbed by the antenna chamber 200.

In an embodiment, an antenna 300 (e.g., the at least one antenna 230) and the holder 240 may be arranged spaced apart from each other at a specified interval d in the antenna chamber 200. The control circuit 210 may be operatively connected with the antenna 300 and/or the holder 240. It is shown that the control circuit 210 is disposed outside the antenna chamber 200, but the control circuit 210 may be disposed inside of the antenna chamber 200. Hereinafter, operations of the respective components of the antenna chamber 200 may be understood as being substantially performed by the control circuit 210. FIG. 3 is illustrative, and the antenna chamber 200 may further include various components (e.g., the wireless communication circuit 260) which are not shown in FIG. 3.

The holder 240 may be implemented with a turn table 320, a support column 322, and/or an arm 324. The mounting part 255 may be implemented as a part of the arm 324. The turn table 320, the support column 322, and/or the arm 324 may be connected with each other by at least one joint and may be adjusted (or rotated) by the at least one driving part 250. For example, the control circuit 210 may adjust each component of the holder 240 using the at least one driving part 250 to rotate the mounting part 255. The structure of the holder 240 of FIG. 3 is illustrative, and the holder 240 may be implemented as another structure capable of rotating the mounting part 255.

In an embodiment, the control circuit 210 may radiate a test signal using the antenna 300. The control circuit 210 may rotate the antenna 300 in a clockwise direction or a counterclockwise direction.

In an embodiment, the DUT 220 may receive the test signal radiated from the antenna 300 using the main antenna 222. A signal which arrives at a wall surface of the antenna chamber 200 among test signals radiated from the antenna 300 may be absorbed by a wall surface of the antenna chamber 200. Thus, the test signal received by the DUT 220 may be a signal moved through a line of sight (LoS) path. The LoS path may be a straight path between the antenna 300 and the DUT 220.

The DUT 220 may transmit the information associated with the test signal to the control circuit 210 through the wireless communication circuit 224. The control circuit 210 may measure a receive sensitivity of the test signal based on the received information. Hereinafter, a description will be given of a method for measuring a receive sensitivity of the test signal, which is performed in the antenna chamber 200. The receive sensitivity in disclosure may be referred to as total isotropic sensitivity (TIS).

In an embodiment, the control circuit 210 may radiate a test signal (e.g., an L1 signal or an L5 signal) of a specified intensity using the antenna 300.

For example, an intensity of the test signal radiated by the antenna 300 may be −130 dBm. −130 dBm may be understood as an intensity of a GPS signal received from a satellite in a general atmospheric environment.

In an embodiment, the control circuit 210 may radiate a test signal at various angles. For example, the control circuit 210 may radiate the test signal in a state where it rotates the antenna 300 90 degrees in a clockwise direction or a counterclockwise direction.

The control circuit 210 may move and/or rotate the mounting part 255 using at least one driving part 250.

For example, the control circuit 210 may rotate the turn table 320 in a rotation direction 1 using the at least one driving part 250. The rotation direction 1 is shown as a counterclockwise direction, or vice versa. θ may be a rotation angle which is previously defined on a rotation plane of the rotation direction 1. The mounting part 255 and the DUT 220 may rotate together along rotation of the turn table 320. The main antenna 222 of the DUT 220 may be located on a rotary axis x of the turn table 320. In this case, the main antenna 222 may rotate at a fixed position.

For example, the control circuit 210 may rotate the arm 324 in a rotation direction 2 using the at least on driving part 250. The rotation direction 2 is shown as a counterclockwise direction, or vice versa. φ may be a rotation angle which is previously defined on a rotation plane of the rotation direction 2. The mounting part 255 and the DUT 220 may rotate together along rotation of the arm 324. The main antenna 222 of the DUT 220 may located on a rotary axis y of the arm 324 orthogonal to the rotary axis x. In this case, the main antenna 222 may rotate at a fixed position.

In an embodiment, the control circuit 220 may receive a test signal at a plurality of specified angles. The plurality of specified angles may be defined as a combination of the rotary axes θ and φ and the angle of the antenna 300. For example, it may be referred to as 0 when the angle of the antenna 300 among the plurality of specified angles is 0 degree, and it may be referred to as 1 when the angle of the antenna 300 is 90 degrees. For example, the specified angles may be (30 degrees, 60 degrees, 1). In this case, the DUT 220 may be in a state where it rotates 30 degrees in the rotation direction 1 and a state where it rotates 60 degrees in the rotation direction 2, and the angle of the antenna 300 may be 90 degrees.

The DUT 220 may measure a carrier to noise ratio (CN0) for the test signal received at the plurality of specified angles. The number of the plurality of specified angles may be previously determined. The DUT 220 may transmit the information associated with the test signal to the control circuit 210. For example, the DUT 220 may transmit a CN0 value of the test signal to the control circuit 210. For another example, the DUT 220 may transmit information associated with positioning to the control circuit 210. For another example, the DUT 220 may transmit a positioning result (e.g., the measured latitude and/or longitude of the DUT 220) to the control circuit 210.

In an embodiment, the control circuit 210 may identify a radiation pattern of the test signal based on the received information. For example, the control circuit 210 may identify the radiation pattern of the test signal based on a CN0 value measured by the DUT 220 at the plurality of specified angles.

Referring to FIG. 4A, reference numeral 410 may be understood as a radiation pattern formed by a test signal (e.g., an L1 signal). The radiation pattern 410 may indicate reception performance of the main antenna 222 for the test signal. For example, reception performance for a direction 400 of the main antenna 220 may be higher than reception performance for a direction 405. The direction 400 may be understood as a direction corresponding to an angle where the CN0 value is maximum.

The control circuit 210 may control such that the antenna 300 radiates the test signal while decreasing an intensity of the test signal by a specified intensity (e.g., 1 dBm) at an angle where the DUT 220 has a maximum CN0 value. The DUT 220 may measure a CN0 for the test signal and may transmit the measured CN0 value to the control circuit 210. The control circuit 210 may identify linearity of reception performance of the main antenna 222 based on the received CN0 value. In this manner, the control circuit 210 may identify that a CN0 value on the radiation pattern represents reception performance of the DUT 220 at the corresponding angle.

The control circuit 210 may measure a sensitivity of the test signal at an angle where the CN0 value is maximum. For example, the control circuit 210 may receive information about the test signal from the DUT 220 at an angle where the DUT 220 has the maximum CN0 value. The control circuit 210 may perform positioning based on the received information. The control circuit 210 may compare the positioning result with a position of the DUT 220 in the antenna chamber 200 to identify an error rate.

The control circuit 210 may repeat positioning while reducing an intensity of the test signal radiated by the antenna 300 at the angle where the DUT 220 has the maximum CN0 value. The control circuit 210 may repeat positioning to a point where the error rate of the positioning is greater than or equal to a threshold. The control circuit 210 may identify an electric field, measured at a minimum intensity of the test signal where positioning is normally possible, as sensitivity at the corresponding angle. For example, when the error rate of the positioning is less than the threshold, the positioning at the corresponding angle may be understood as being normally possible.

The control circuit 210 may calculate a receive sensitivity (TIS) based on the CN0 value and the sensitivity. The TIS may be a minimum signal level where the DUT 220 may normally perform positioning, when the DUT 220 receives the same signal in all directions. The TIS may be used as an indicator indicating a receive sensitivity of the DUT 220. The TIS may be calculated using Equation 1.

$$TIS = \frac{2N * M * CN0(\text{peak}) * \text{sensitivity}(\text{peak})}{\pi \sum_{i=1}^{N-1} \sum_{j=0}^{M-1} [CN0_\Theta(\Theta_i, \varnothing_j) + CN0_\varnothing(\Theta_i, \varnothing_j)] \sin(\Theta_i)}$$ [Equation 1]

CN0 (peak) may be a maximum CN0 value measured by the DUT 220. Sensitivity (peak) may be a sensitivity of the test signal identified at an angle where the CN0 value is maximum. N and M are random integers greater than 1. N may be the number of specified angles which is previously defined on a rotation plane corresponding to the rotation direction 1. M may be the number of specified angles which is previously defined on a rotation plane corresponding to the rotation direction 2.

Hereinafter, a description will be given of an example method for measuring a TIS, which is performed in the antenna chamber, when the test signal includes a plurality of different tests signals (an L1 signal and an L5 signal) and when measurement of a receive sensitivity for a test signal (e.g., the L5 signal) to be measured is based on another test signal (e.g., the L1 signal).

In an embodiment, the antenna 300 may radiate the L1 signal and the L5 signal. The DUT 220 may measure CN0 of the L5 signal, in response to receiving the L1 signal. The DUT 220 may transmit a CN0 value of the L5 signal to the control circuit 210. The control circuit 210 may form a radiation pattern for the L5 signal based on the CN0 value.

Referring to FIG. 4B, reference numeral 410 may be a radiation pattern formed by the L1 signal. Reference numeral 420 may be a radiation pattern formed by the L5 signal. The radiation patterns formed by the L1 signal and the L5 signal may be different from each other. In an embodiment, the control circuit 210 may only identify the radiation pattern of the L5 signal based on the information received from the DUT 220 and may fail to identify the radiation pattern of the L1 signal. Thus, the radiation pattern 410 may be understood as a virtual radiation pattern.

The DUT 220 may have high reception performance at different angles for the L1 signal and the L5 signal. For example, in the main antenna 222, reception performance for a direction 440 may be higher than reception performance for a direction 445, in conjunction with the L1 signal. For example, in the main antenna 222, the reception performance for the direction 445 may be higher than the reception performance for the direction 440, in conjunction with the L5 signal. The direction 445 may be a direction corresponding to an angle where the DUT 220 has a maximum CN0 value with respect to the L5 signal.

In an embodiment, intensity of the L1 signal for a certain range 430 may be a weak electric field. For example, an intensity of the L1 signal received by the DUT 220 may be a weak electric field with respect to the direction 445.

Referring again to FIG. 3, the control circuit 210 may reduce an intensity of a test signal radiated by the antenna 300 to measure sensitivity at an angle (corresponding to the direction 445) where the DUT 220 has the maximum CN0 with respect to the L5 signal. For example, the antenna 300 may reduce an intensity of the L1 signal and an intensity of the L5 signal.

In an embodiment, as the intensity of the L1 signal is reduced, the DUT 220 may fail to receive the L1 signal or the intensity of the L1 signal received by the LUT 220 may be a weak electric field. In this case, irrespective of the intensity of the L5 signal, the intensity of the L5 signal identified at the corresponding angle may be inaccurate. TIS calculation based on inaccurate sensitivity may be inaccurate.

Hereinafter, an example method for enhancing inaccurate TIS measurement is described in greater detail.

Figure 5:
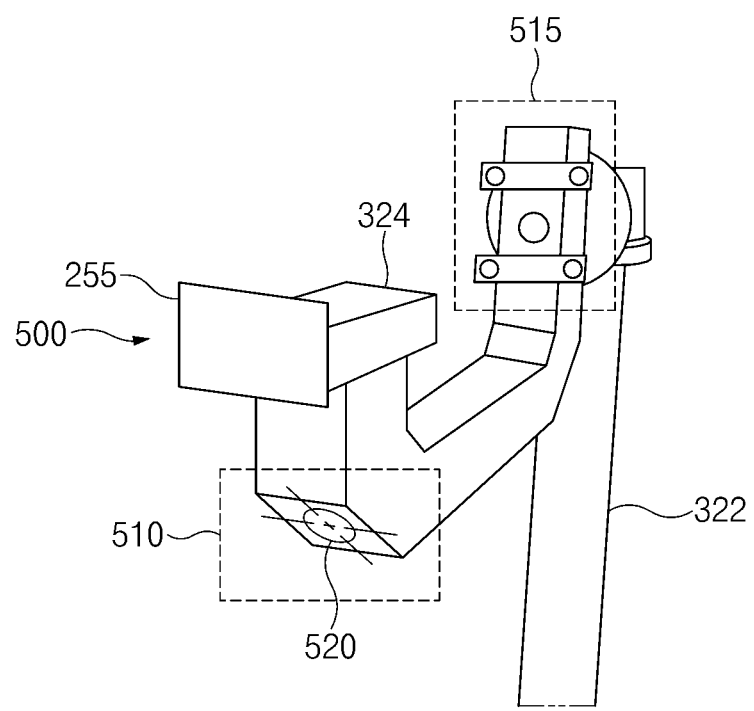
FIG. 5 is a diagram illustrating an example antenna chamber structure for improving the accuracy of measuring a receive sensitivity, according to various embodiments.
Figure 6:
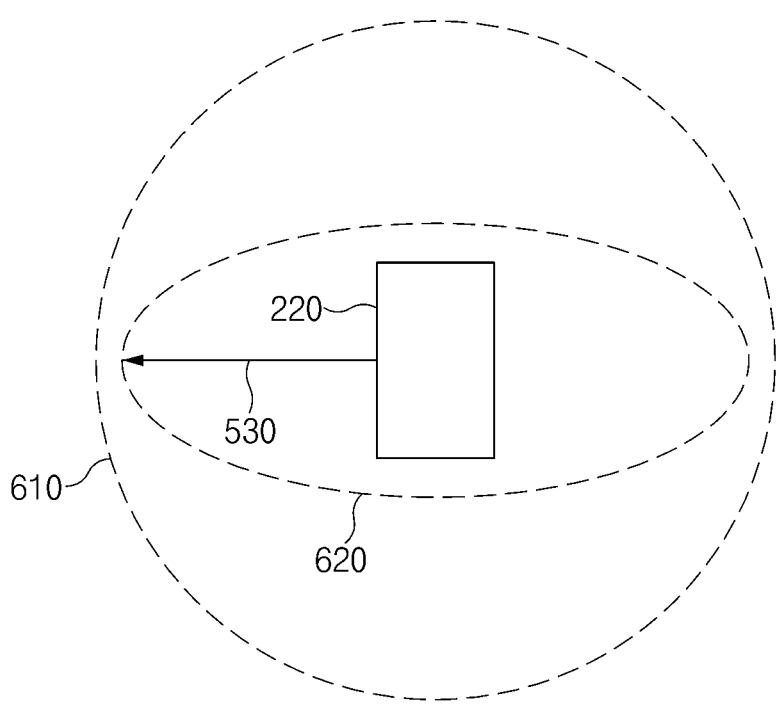
FIG. 6 is a diagram illustrating an example radiation pattern formed by a test signal according to various embodiments.

FIG. 5 is a diagram illustrating an example antenna chamber structure for improving the accuracy of measuring a receive sensitivity, according to various embodiments. FIG. 6 is a diagram illustrating an example radiation pattern formed by a test signal according to various embodiments. The description of components of FIG. 2 or 3 may be referenced to describe FIGS. 5 and 6.

Reference numeral 500 illustrates a part of a holder 240. The other components of an antenna chamber 200 except for the holder 240 may be the same as or similar to those shown in FIG. 3.

The antenna chamber 200 may further include at least one first antenna 520. In an embodiment, the at least one first antenna 520 may be disposed on a first region 510 of the holder 240. For example, the first region 510 may be one region of an arm 324. In an embodiment, the at least one first antenna 520 may be disposed on another region (e.g., a second region 515) of the holder 240. For example, the first region 510 may be one region of the arm 324. For example, the second region 515 may be one region of a support column 322.

The at least one first antenna 520 may be disposed on at least one of the first region 510 or the second region 515 to form a fixed angled with a DUT 220. The position of the at least one first antenna 520 shown in FIG. 5 is illustrative, and the at least one first antenna 520 may be disposed on another position of the holder 240 to form a fixed angle with the DUT 220.

A plurality of test signals, each of which has a different frequency, in FIG. 5 may be radiated by different antennas. For example, the at least one first antenna 520 may radiate a first test signal (e.g., an L1 signal). For example, an antenna 300 may radiate a second test signal (e.g., an L5 signal). Hereinafter, the antenna 300 may be a second antenna.

The control circuit 210 may rotate the DUT 220 using at least one driving part 250. For example, the DUT 220 may rotate in a rotation direction 1 or a rotation direction 2. A main antenna 222 of the DUT 220 may be located on a rotary axis of the rotation direction 1 or the rotation direction 2. In this case, the main antenna 222 may rotate at a fixed position.

When the DUT 220 rotates, the at least one first antenna 520 may rotate together. For example, the at least one first antenna 520 may rotate while maintaining a fixed angle and/or interval with the DUT 220.

In an embodiment, the control circuit 210 may radiate a test signal, while rotating the DUT 220. For example, the control circuit 210 may radiate the L1 signal using the at least one first antenna 520. For example, the control circuit 210 may radiate the L5 signal using the second antenna.

Because the at least one first antenna 520 rotates together with the DUT 220 while maintaining the fixed angle and/or interval with the DUT 220, an intensity of the L1 signal received from the at least one first antenna 520 by the DUT 220 may be constant or an intensity within a specified range.

Referring to FIG. 6, reference numeral 610 may be a radiation pattern formed by the L1 signal. The radiation pattern 610 may be a virtual radiation pattern. For example, reference numeral 620 may be a radiation pattern formed by the L5 signal. For example, the DUT 220 may have reception performance of a similar level to the L1 signal at all angles. The DUT 220 may perform normal positioning based on the L5 signal irrespective of an intensity of the L1 signal in a direction 530.

The radiation pattern is shown as a globular shape in FIG. 6. However, the radiation pattern 610 may have any shape. Although the radiation pattern 610 has the any shape, the DUT 220 may perform normal positioning based on the L5 signal irrespective of the L1 signal. For example, when the radiation pattern 610 has any shape, the intensity of the L1 signal at all angles of the DUT 220 may be greater than or equal to a minimum intensity capable of performing normal positioning based on the L1 signal. For another example, when the radiation pattern 610 has any shape, the control circuit 210 may control an intensity of the L1 signal at a specific angle in software. For example, the control circuit 210 may control the at least one first antenna 520 to increase the intensity of the L1 signal at a specific angle. In this case, at the specific angle, the intensity of the L1 signal may be greater than or equal to the minimum intensity capable of performing the normal positioning based on the L1 signal.

Referring again to FIG. 5, when identifying the sensitivity of the L5 signal, the control circuit 210 may decrease the intensity of the L5 signal radiated by the second antenna at a plurality of specified angles. When the intensity of the L5 signal decreases, the intensity of the L1 signal received by the DUT 220 may be constant or may be maintained at an intensity within a specified range. In an embodiment, the control circuit 210 may identify an electric field measured at a minimum intensity of the L5 signal capable of normally performing positioning as a sensitivity of the corresponding angle (e.g., an angle corresponding to the direction 530).

The sensitivity of the L5 signal measured in an embodiment according to FIG. 5 may be more accurate than sensitivity identified in an embodiment according to FIG. 3. The antenna chamber 200 may calculate an accurate TIS based on the identified sensitivity.

FIG. 5 is only one example for enhancing accuracy of the TIS, and the antenna chamber 200 may be designed in various methods to accomplish the same purpose. For example, the at least one first antenna 520 may be disposed on an inner wall of the antenna chamber 200.

In an embodiment, an anechoic antenna chamber 200 may include a holder 240 on which a DUT 220 is able to be mounted, at least one first antenna configured to radiate a first test signal of a first frequency band, a second antenna configured to be provided at an inner side of the antenna chamber 200 and radiate a second test signal of a second frequency, at least one driving part 250 configured to rotate the DUT 220, and a control circuit 210 operatively connected with the at least one first antenna, the second antenna, and the at least one driving part 250. The control circuit 210 may be configured to rotate the DUT 220 using the at least one driving part 250 and radiate the first test signal having an intensity of a specified range through the at least one first antenna and radiate the second test signal through the second antenna, while rotating the DUT 220.

In an embodiment, the at least one first antenna may be mounted on a mounting part 255 to form a fixed angle with the DUT 220, when the DUT 220 is mounted on the mounting part 255. The control circuit 210 may be configured to rotate the at least one first antenna together with the DUT 220 using the at least one driving part 250.

In an embodiment, the at least one first antenna may be provided on an inner wall of the antenna chamber 200. The control circuit 210 may be configured to radiate the first test signal through some of the at least one first antenna. The control circuit 210 may be configured to, when the DUT 220 rotates, radiate the first test signal based on a switching operation of the at least one first antenna.

In an embodiment, the first test signal and the second test signal may be signals based on a global navigation satellite system (GNSS). The first test signal may include an L1 signal, and the second test signal may include an L5 signal.

In an embodiment, the control circuit 210 may be configured to correct an error of positioning based on the first test signal using the second test signal. The control circuit 210 may be configured to measure a receive sensitivity of the second test signal based on the first test signal received through the DUT 220.

In an embodiment, the at least one driving part 250 may include a bearing structure.

In an embodiment, the at least one driving part 250 may include a first driving part (e.g., including a driver, motor, etc.) for rotating the at least one mounting part 255 about a first rotary axis and a second driving part for rotating the at least one mounting part 255 about a second rotary axis perpendicular to the first rotary axis. In an embodiment, the control circuit 210 may be configured to rotate the DUT 220 on at least one plane using the at least one driving part 250. In an embodiment, a main antenna 222 included in the DUT 220 may be disposed at a fixed position on the first rotary axis and the second rotary axis.

In an embodiment, the control circuit 210 may be configured to identify a radiation pattern of the second test signal received by the DUT 220 at a specified angle, while the DUT 220 rotates about the first rotary axis or the second rotary axis. The control circuit 210 may be configured to radiate the second test signal at a specified intensity, when identifying the radiation pattern of the second test signal.

In an embodiment, the control circuit 210 may be configured to linearize the identified radiation pattern. In an embodiment, the control circuit 210 may be configured to measure a sensitivity of the second test signal while adjusting an intensity of the second test signal, based on the radiation pattern.

In an embodiment, the control circuit 210 may be configured to calculate a total isotropic sensitivity (TIS) of the second test signal based on the radiation pattern and the sensitivity.

In an embodiment, the antenna chamber 200 may further include at least one of a network emulator, a global navigation satellite system (GNSS) simulator, or a positioning controller. The control circuit 210 may be implemented as a part of at least one of the network emulator, the GNSS simulator, or the positioning controller.

In an embodiment, the antenna chamber 200 may further include an embossing structure. The embossing structure may be provided on an inner wall of the antenna chamber 200. In an embodiment, the antenna chamber 200 may further include a wireless communication circuit 260. The control circuit 210 may be configured to receive information associated with the second test signal from the DUT 220 through the wireless communication circuit 260.

Figure 7A:
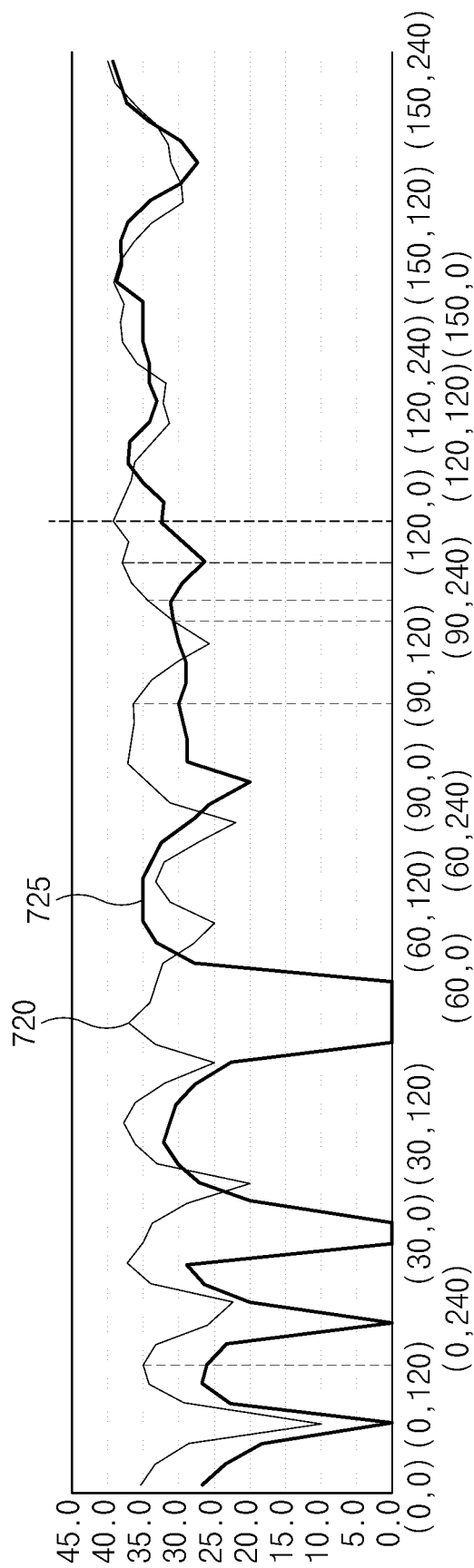
FIG. 7A is a graph illustrating a CN0 value of a test signal measured in an antenna chamber, according to various embodiments.
Figure 7B:
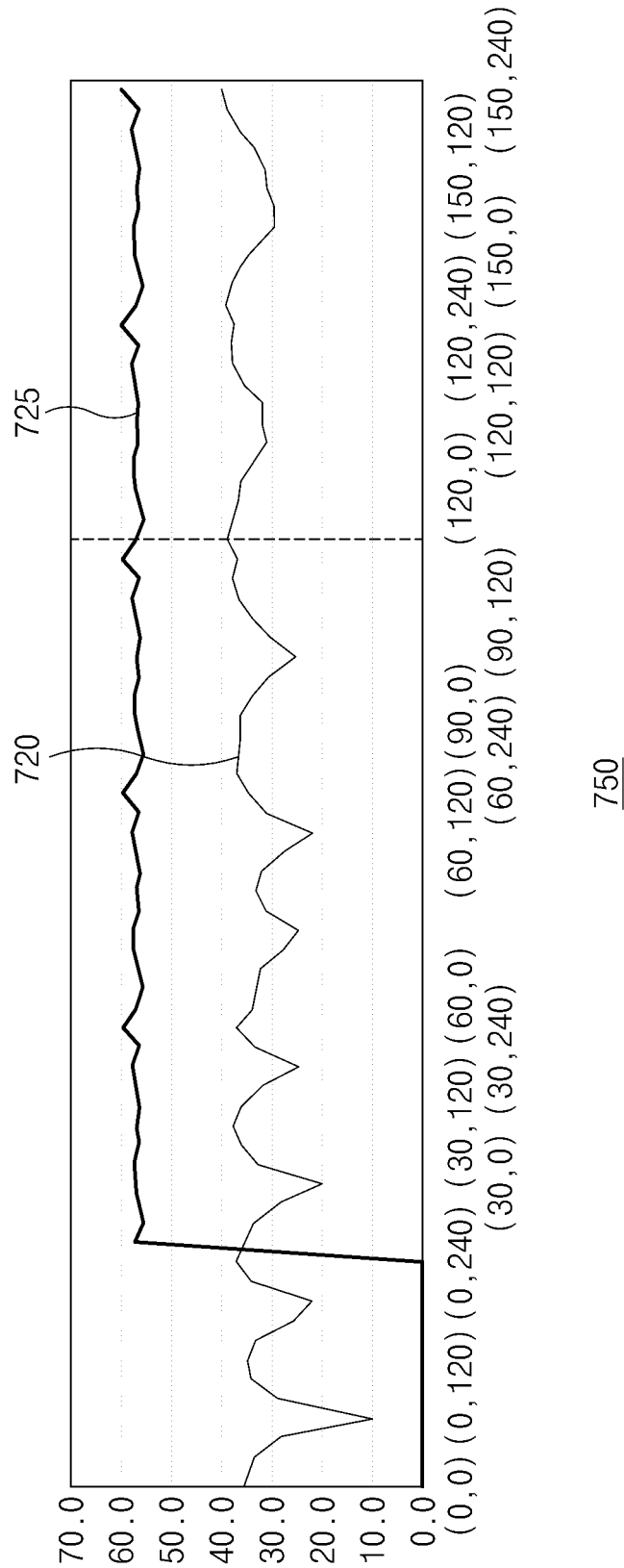
FIG. 7B is a graph illustrating a CN0 value of a test signal measured in an antenna chamber, according to various embodiments.

FIG. 7A is a graph illustrating a CN0 value of a test signal measured in an antenna chamber, according to various embodiments. FIG. 7B is a graph illustrating a CN0 value of a test signal measured in an antenna chamber, according to various embodiments. Components of FIGS. 2 to 6 may be referenced to describe FIGS. 7A and 7B.

In FIGS. 7A and 7B, the vertical axis of graphs 700 and 750 indicates a CN0 value of a test signal (e.g., an L1 signal and an L5 signal) received by a DUT 220. The horizontal axis of the graphs 700 and 750 may indicate an angle (e.g., a plurality of specified angles) of the DUT 220. Referring to the graphs 700 and 750, reference numeral 720 may indicate a second test signal (e.g., an L5 signal) and reference numeral 725 may indicate a first test signal (e.g., an L1 signal).

The graph 700 of FIG. 7A illustrates a CN0 value of a test signal measured in an antenna chamber structure according to FIG. 3.

In an embodiment, a CN0 value of the L1 signal received by the DUT 220 at a specific angle (e.g., (0, 240), (60, 0)) may be 0 (or null). In this case, it may be impossible for the DUT 220 to perform normal positioning using the L1 signal at the corresponding angle. In an embodiment, a sensitivity of the L5 signal measured at an angle (e.g., (0, 240), (60, 0)) where the CN0 value of the L1 signal is 0 (or null) may be inaccurate.

In an embodiment, an intensity of the L1 signal received by the DUT 220 at a specific angle (e.g., (0, 120)) may be less than a minimum electric field required to normally perform positioning based on the L5 signal. When the intensity of the L1 signal is less than the minimum electric field, a receive sensitivity of the L5 signal, which is calculated for the corresponding angle, may be inaccurate.

The graph 750 of FIG. 7B illustrates a CN0 value of a test signal measured in an antenna chamber structure according to FIG. 5. A CN0 value of the L1 signal may be constant or a value within a specified range at all angles of the DUT 220, except for a certain interval (e.g., (0,0)~(30,0)). The certain interval may be understood as an angle where the CN0 of the L1 signal is not measured. For example, the CN0 value of the L1 signal may be maintained between 50 and 60. In this case, the DUT 220 may perform normal positioning based on the L5 signal.

FIG. 7C is a table illustrating examples of a sensitivity and a TIS of a test signal, according to various embodiments. Components of FIGS. 2 to 6 may be referenced to describe FIG. 7C.

A table 770 may indicate a sensitivity and a TIS of an L5 signal, which are calculated in an existing antenna chamber (e.g., an antenna chamber according to FIG. 3) and an improved antenna chamber (e.g., an antenna chamber according to FIG. 5) with respect to a specified angel.

When the CN0 and the sensitivity of the L5 signal are proportional to each other and when the TIS calculated at a plurality of specified angles is uniform, the reliability (or accuracy) of measuring the receive sensitivity may be understood as being high.

In the table 770, it may be understood that the CN0 of the L5 signal and a sensitivity measured in an existing antenna chamber are not proportional to each other, while the CN0 of the L5 signal and a sensitivity measured in an improved antenna chamber are generally proportional to each other.

In the table 770, because a deviation between a maximum value and a minimum value of a TIS calculated in the improved antenna chamber is 2, it may be understood as being less than a deviation (12.6) of the existing antenna chamber. The TIS calculated in the improved antenna chamber may be more uniform than that in the existing antenna chamber.

Thus, a TIS of the L5 signal with high reliability (or accuracy) may be obtained by the improved antenna chamber.

Figure 8:
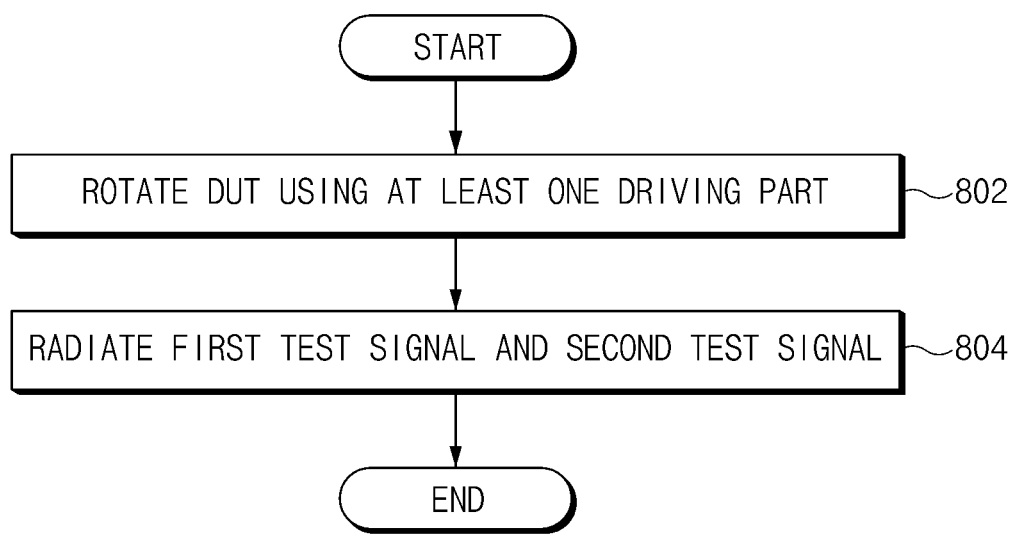
FIG. 8 is a flowchart illustrating an example operation of an antenna chamber, according to various embodiments.

FIG. 8 is a flowchart illustrating an example operation of an antenna chamber, according to various embodiments.

Components of FIGS. 2 to 6 may be referenced to describe FIG. 8.

In operation 802, a control circuit 210 may rotate a DUT 220 using at least one driving part 250. The DUT 220 may rotate along a rotation direction 1 or a rotation direction 2. A main antenna 222 of the DUT 220 may be located on a rotary axis x or a rotary axis y to rotate at a fixed position.

In operation 804, the control circuit 210 may radiate a first test signal and/or a second test signal. For example, the control circuit 210 may radiate the first test signal (e.g., an L1 signal) using at least one first antenna (e.g., at least one first antenna 520). For example, the control circuit 210 may radiate a second test signal (e.g., an L5 signal) using a second antenna (e.g., an antenna 300).

In an embodiment, the at least one first antenna may be mounted on a mounting part 255 of the holder 240 at a fixed angle and/or interval with the DUT 220. A CN0 value of the first test signal received by the DUT 220 from the at least one first antenna may be constant or a value within a specified range.

In an embodiment, the at least one first antenna may be disposed on an inner wall of the antenna chamber 200. For example, the at least one first antenna may be disposed at a different position on the inner wall of the antenna chamber 200 to radiate the first test signal. The at least one first antenna may perform a switching operation depending to rotation of the DUT 220 such that the CN0 value of the first test signal received by the DUT 220 is constant or a value within a specified range.

In an embodiment, the control circuit 210 may calculate a receive sensitivity (a TIS) based on a CN0 value and a sensitivity of the L5 signal identified at a plurality of specified angle.

In an embodiment, the DUT 220 may measure both of a CN0 of the L1 signal and a CN0 of the L5 signal. The control circuit 210 may compare the CN0 value of the L1 signal with the CN0 value of the L5 signal to identify a specific angle where the CN0 value of the L1 signal is higher than the CN0 value of the L5 signal. In this case, the position of the at least one antenna may be irrelevant. The control circuit 210 may increase an intensity of the L1 signal to a specified level at the corresponding angle. The specified level may be an intensity of the L1 signal where the DUT 220 is able to perform normal positioning based on the L5 signal irrespective of the L1 signal at the corresponding angle. In this case, normal positioning based on the L1 signal at all angles of the DUT 220 may be impossible. However, the control circuit 210 may calculate a TIS with high accuracy based on a CN0 value and/or a sensitivity at a specific angle.

Figure 9:
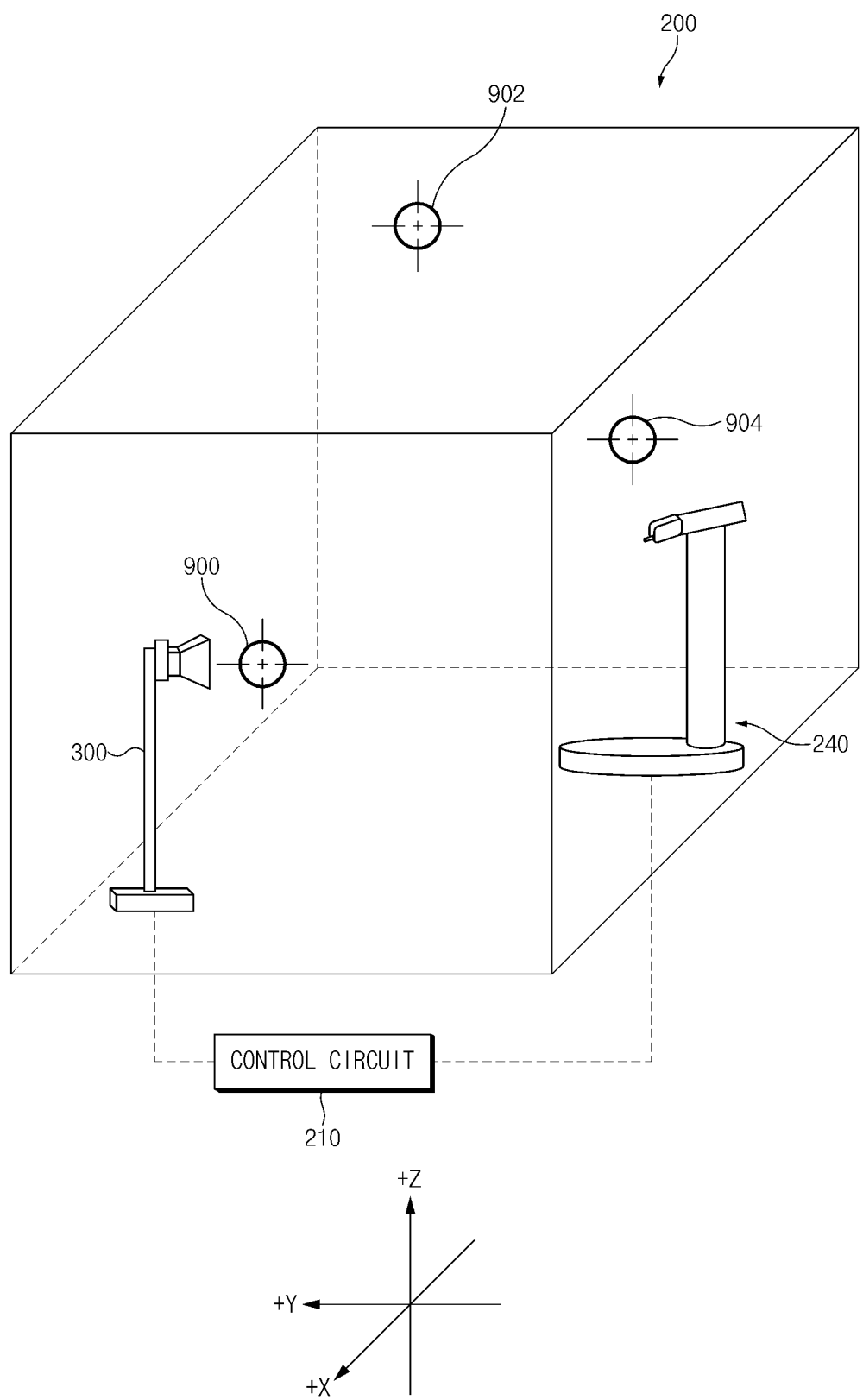
FIG. 9 is a diagram illustrating an example antenna chamber structure for improving the accuracy of measuring a receive sensitivity, according to various embodiments.

FIG. 9 is a diagram illustrating an example antenna chamber structure for improving the accuracy of measuring a receive sensitivity, according to various embodiments.

Components of FIGS. 2 to 6 may be referenced to describe FIG. 9.

In an embodiment, an antenna chamber 200 may be implemented as a room structure having a cube shape. The antenna chamber 200 may include an inner wall corresponding to each direction (e.g., a +X-axis direction, a −X-axis direction, a +Y-axis direction, a —Y-axis direction, a +Z-axis direction, or a −Z-axis direction).

At least one first antenna 900, 902, and 904 may be disposed on the inner wall of the antenna chamber 200. For example, the at least one first antenna 900, 902, and 904 may be disposed at a different position on the inner wall of the antenna chamber 200. For example, the 1-1st antenna 900 may be disposed on the inner wall corresponding to the +X-axis direction. For example, the 1-2nd antenna 902 may be disposed on the inner wall corresponding to the +Z-axis direction. For example, the 1-3rd antenna 904 may be disposed on the inner wall corresponding to the −X-axis direction.

A holder 240 and an antenna 300 (e.g., a second antenna) may be arranged in the antenna chamber 200. The holder 240 and the antenna 300 may be arranged spaced apart from each other at a specified interval. A DUT 220 may be disposed on a mounting part 255 of the holder 240. The antenna 300 may be referred to as the second antenna.

The control circuit 210 may rotate the DUT 220 using at least one driving part 250. The control circuit 210 may radiate a first test signal (e.g., an L1 signal) through the at least one first antenna 900, 902, and 904. The control circuit 210 may radiate a second test signal (e.g., an L5 signal) through the antenna 300. For example, the antenna 300 may be an antenna which radiates a signal to be tested.

The control circuit 210 may control the at least one first antenna 900, 902, and 904 such that a CN0 value of the first test signal received by the DUT 220 is constant or a value within a specified range.

In an embodiment, the at least one first antenna 900, 902, and 904 may be controlled to perform a switching operation. For example, the control circuit 210 may radiate the first test signal using some (e.g., the 1-1st antenna 900) of the at least one first antenna 900, 902, and 904. When the first test signal received by the DUT 220 is a weak electric field as the DUT 220 rotates, the control circuit 210 may switch the 1-1st antenna to some (e.g., the 1-2nd antenna) of the at least one first antenna 900, 902, and 904 to radiate the first test signal using the 1-2nd antenna.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An anechoic antenna chamber, comprising:
   a holder on which a device under test (DUT) is configured to be mounted;
   at least one first antenna configured to radiate a first test signal of a first frequency band;
   a second antenna provided at an inner side of the antenna chamber and configured to radiate a second test signal of a second frequency;
   at least one driver configured to rotate the DUT; and
   a control circuit operatively connected with the at least one first antenna, the second antenna, and the at least one driving part,
   wherein the control circuit is configured to:
      control the at least one driver to rotate the DUT; and
      control the at least one first antenna to radiate the first test signal having an intensity of a specified range and control the second antenna to radiate the second test signal, while rotating the DUT, and
   wherein the at least one driver includes:
      a first driver configured to rotate at least one mounting part about a first rotary axis; and
      a second driver configured to rotate the at least one mounting part about a second rotary axis perpendicular to the first rotary axis.

2. The anechoic antenna chamber of claim 1, wherein the at least one first antenna is mounted on a mounting part of the holder to form a fixed angle with the DUT, based on the DUT being mounted on the mounting part of the holder.

3. The anechoic antenna chamber of claim 2, wherein the control circuit is configured to:
   rotate the at least one first antenna together with the DUT using the at least one driver.

4. The anechoic antenna chamber of claim 1, wherein the at least one first antenna is provided on an inner wall of the antenna chamber, and
   wherein the control circuit is configured to:
   radiate the first test signal through some of the at least one first antenna.

5. The anechoic antenna chamber of claim 4, wherein the control circuit is configured to:
   based on the DUT rotating, radiate the first test signal based on a switching operation of the at least one first antenna.

6. The anechoic antenna chamber of claim 1, wherein the first test signal and the second test signal are signals based on a global navigation satellite system (GNSS),
   wherein the first test signal includes a signal of the 1575.42 MHz band, and
   wherein the second test signal includes a signal of the 1176.45 MHz band.

7. The anechoic antenna chamber of claim 6, wherein the control circuit is configured to:

correct an error of positioning based on the first test signal using the second test signal.

8. The anechoic antenna chamber of claim 6, wherein the control circuit is configured to:
measure a receive sensitivity of the second test signal based on the first test signal received through the DUT.

9. The anechoic antenna chamber of claim 1, wherein the at least one driver includes a bearing.

10. The anechoic antenna chamber of claim 1, wherein the control circuit is configured to:
rotate the DUT on at least one plane using the at least one driver.

11. The anechoic antenna chamber of claim 1, wherein a main antenna included in the DUT is disposed at a fixed position on the first rotary axis and the second rotary axis.

12. The anechoic antenna chamber of claim 1, wherein the control circuit is configured to:
identify a radiation pattern of the second test signal received by the DUT at a specified angle, while the DUT rotates about the first rotary axis or the second rotary axis.

13. The anechoic antenna chamber of claim 12, wherein the control circuit is configured to:
radiate the second test signal at a specified intensity, based on identifying the radiation pattern of the second test signal.

14. The anechoic antenna chamber of claim 13, wherein the control circuit is configured to:
linearize the identified radiation pattern.

15. The anechoic antenna chamber of claim 13, wherein the control circuit is configured to:
measure a sensitivity of the second test signal while adjusting an intensity of the second test signal, based on the radiation pattern.

16. The anechoic antenna chamber of claim 15, wherein the control circuit is configured to:
calculate a total isotropic sensitivity (TIS) of the second test signal based on the radiation pattern and the sensitivity.

17. The anechoic antenna chamber of claim 1, further comprising:
at least one of a network emulator, a global navigation satellite system (GNSS) simulator, or a positioning controller,
wherein the control circuit is included as a part of at least one of the network emulator, the GNSS simulator, or the positioning controller.

18. The anechoic antenna chamber of claim 1, further comprising:
an embossing structure comprising an embossing material configured to absorb a signal radiated from at least one antenna,
wherein the embossing structure is provided on an inner wall of the antenna chamber.

19. The anechoic antenna chamber of claim 1, further comprising:
a wireless communication circuit,
wherein the control circuit is configured to:
receive information associated with the second test signal from the DUT through the wireless communication circuit.

* * * * *